United States Patent [19]

Nakashima

[11] Patent Number: 5,027,328

[45] Date of Patent: Jun. 25, 1991

[54] MEMORY DRIVE DEVICE AND METHOD

[75] Inventor: Tomoyuki Nakashima, Hino, Japan

[73] Assignee: Kabushiki Kaisha Toshiba, Kawasaki, Japan

[21] Appl. No.: 500,458

[22] Filed: Mar. 28, 1990

[30] Foreign Application Priority Data

Mar. 30, 1989 [JP] Japan .................................. 1-80160

[51] Int. Cl.⁵ .............................................. G11C 13/00
[52] U.S. Cl. ................................ 365/226; 365/189.07; 307/362
[58] Field of Search ...................... 361/92; 365/189.07, 365/226, 189.01; 307/362

[56] References Cited

U.S. PATENT DOCUMENTS

| 4,296,338 | 10/1981 | Thomas | 307/362 |
| 4,520,418 | 5/1985 | Susi | 361/92 |
| 4,961,166 | 10/1990 | Sato et al. | 365/208 |

FOREIGN PATENT DOCUMENTS 298215 1/1989 European Pat. Off. .

Primary Examiner—Terrell W. Fears
Attorney, Agent, or Firm—Foley & Lardner

[57] ABSTRACT

In a memory drive device comprising a semiconductor memory, a memory control circuit for controlling the operation of the memory, the control circuit including a reset terminal and operative to initialize the internal status when a reset signal of a predetermined level is applied to the reset terminal, and a main power supply for delivering a power to the memory and to the memory control circuit, the memory drive device comprises a comparator circuit for comparing a power feed voltage from the main power supply with a predetermined threshold voltage and for detecting that the power feed reaches predetermined voltage to output a detection signal, and a reset circuit responsive to a detection signal from the comparator circuit to generate a reset signal of a predetermined logic level for at least a predetermined time period to apply a reset signal to the reset terminal. At the time when the main power supply is turned on, or at the time of recovery of service interruption, for at least a predetermined time period from the time when the output level of the main power supply has a predetermined threshold voltage irrespective of a rise speed of the main power supply voltage, a reset signal of a predetermined logic level is applied to the memory control circuit.

7 Claims, 4 Drawing Sheets

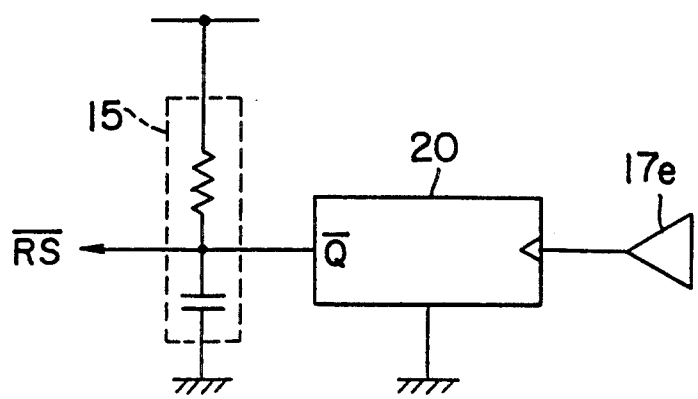
F I G. 4
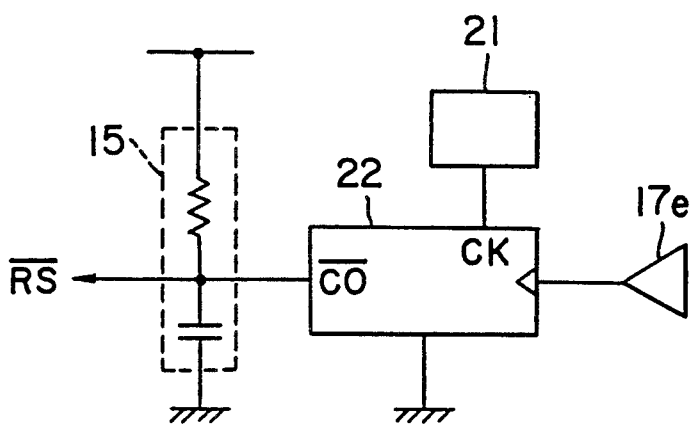
F I G. 5

MEMORY DRIVE DEVICE AND METHOD

BACKGROUND OF THE INVENTION

This invention relates to a semiconductor memory device and method such as a RAM or an EPROM assembled in apparatus such as a telephone system, etc., and more particularly to a memory drive device and method including a control circuit for controlling an access to the memory, and having a function of resetting the state of the control circuit at the time when a power supply of the equipment is turned on, or at the time of recovery of interruption to service, etc. and a memory drive method using this device.

Generally, semiconductor memories become operative by delivering an address signal and various control signals from a memory control circuit such as a microcomputer to such memories. In apparatus, such as, for example, a telephone system including a semiconductor memory incorporated therein, at the time of turning a power on, or at the time of recovery of service interruption, it is necessary to deliver, to a memory control circuit, a reset command in order to initiate the operation in a normal state to return its internal status to a predetermined initial state.

In the case where semiconductor memories are of the type necessary to be supplied with a power at all times, such as a RAM or an EPROM, a backup power supply is required for ensuring supply of power at the time of service interruption of a main power supply. Since such a backup power supply is ordinarily a battery, it is dissipated when used for a long time. In the case where the main power supply service interruption is recovered after the backup power supply has been dissipated, information stored in a memory have been already deteriorated or vanished. Accordingly, it is necessary for initiating a normal operation to clear the information stored in the memory. This clear operation is practically carried out by delivering a memory clear command when a reset command is delivered to the memory control circuit.

As described in detail later, conventional memory drive devices include a RC time constant circuit connected to the main power supply line as a circuit for delivering a reset command to the memory control circuit. This RC time constant circuit generates a voltage signal gently rising in a ramp form depending upon a time constant when a main power supply voltage has risen in a step form at the time of turning a main power supply on, or at the time of recovery of interruption to service. This voltage signal is applied to the memory control circuit as a reset signal. When the memory control circuit has been operative by the step-shaped rising of the power supply voltage, the reset signal is in the state where its voltage level is lower than a predetermined threshold level, i.e., its logic level is low ("L"). The memory control circuit recognizes the "L" level of the reset signal as a reset command, thus to initialize the internal status.

However, in the case where the main power supply voltage gently rises in a time nearly to a time constant of the RC time constant circuit or more for any reason, since the reset signal is in the state where the voltage level is higher than a threshold level, i.e., the logic level is high ("H") when the memory control circuit has been in an operating state, there is the problem that the memory control circuit cannot be reset.

Further, such conventional memory drive circuits only include a manual switch for the purpose of delivering a memory clear command to the memory control circuit. Namely, whether memory should be cleared or not depends upon the judgment by user. However, there is great possibility that user forgets clearing the memory without being aware of dissipation of the backup power supply.

As stated above, the conventional memory drive devices cannot ensure that the operation of the apparatus is initiated in a normal state at the time when a main power supply is turned on, or at the time of recovery of interruption to service.

SUMMARY OF THE INVENTION

An object of this invention is to provide a memory drive device which is constructed to securely reset the memory control circuit at the time when a main power supply is turned on, or at the time of recovery of interruption to service, thereby making it possible to normally initiate the operation of the apparatus.

In accordance with this invention, there is provided a memory drive device comprising a semiconductor memory, a memory control circuit for controlling the operation of the memory, the control circuit including a reset terminal and operative to initialize the internal status when a reset signal of a predetermined level is applied to the reset terminal, and a main power supply for delivering a power to the memory and to the memory control circuit, the memory drive device comprising: a comparator means which compares an output voltage from the main power supply with a predetermined threshold voltage, and detects rise of the supply voltage to a predetermined voltage level, and delivers detection signals, and a rest means which applies to reset signals to reset terminals of the memory control circuits at least for a predetermined period of time in response to the detection signals delivered from the comparator means.

In the device according to this invention, if an output level of the main power supply rises up to a predetermined threshold voltage at the time when a main power supply is turned on, or at the time of recovery of interruption to service, a reset command is then generated for a predetermined time period. When that time period is set to a sufficient length, reset operation of the memory control circuit is securely carried out irrespective of a rise speed of the main power supply.

In a preferred embodiment of this invention, there is further provided means for generating a third signal which takes different logic levels depending upon whether or not the backup power supply is dissipated. This third signal is delivered to the memory control circuit as a memory clear signal. Where the backup power supply has been already dissipated before the main power supply is turned on, or before interruption to service is recovered, the memory control circuit securely receives a memory clear command to clear the memory after the main power supply is turned on, or after service interruption is recovered.

BRIEF DESCRIPTION OF THE DRAWINGS

In the accompanying drawings:

FIG. 4 is a circuit diagram showing another embodiment of the reset signal output circuit; and FIG. 5 is a circuit diagram showing further another embodiment of the reset output circuit.

DESCRIPTION OF THE PREFERRED EMBODIMENT

Figure 1:
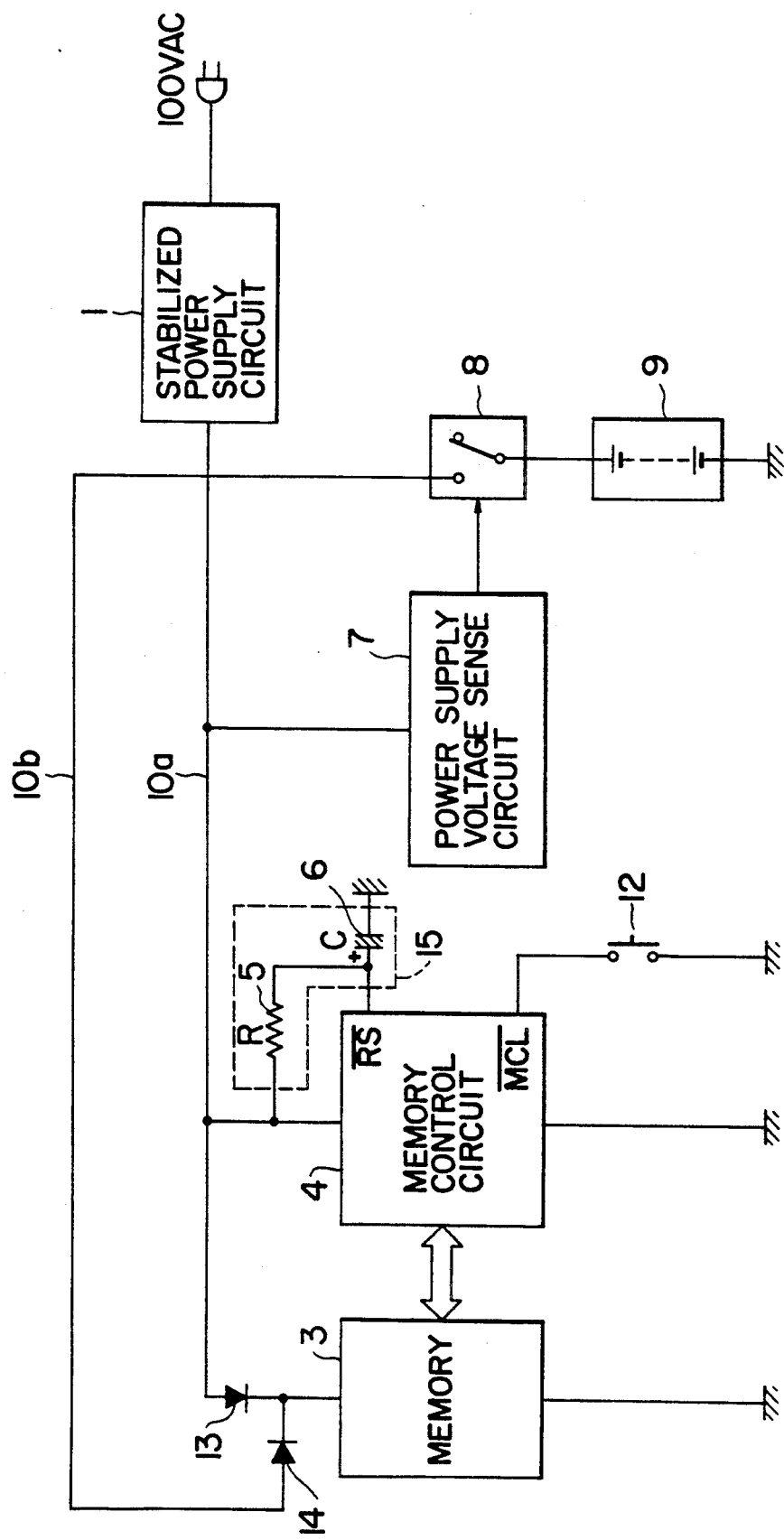
FIG. 1 is a block diagram showing an entire circuit configuration of a conventional memory drive device.

FIG. 1 is a block diagram showing the circuit arrangement of a conventional memory drive device.

In FIG. 1, the stabilized power supply circuit 1 serves as a main power supply of this device. This power supply circuit 1 receives an AC voltage of 100 V from a commercial power supply to generate a DC constant voltage. This DC voltage is delivered through a main power supply line 10a to a power supply voltage sense circuit 7, a RC time constant circuit 15, and a memory control circuit (e.g., a microcomputer) 4, and is also delivered through the main power supply line 10a and a reverse-current prevention diode 13 to a memory 3. The memory backup power supply 9 may be, e.g., a battery for effecting a memory backup at the time of service interruption. When connected to the power supply line 10b as a result of the fact that a relay switch 8 is turned on, the memory backup power supply 9 delivers a backup power to the memory 3 through the power supply line 10b and the reverse-current prevention diode 14.

The power supply voltage sense circuit 7 senses that an output voltage from the stabilized power supply circuit 1 is lowered below a predetermined value due to service interruption, etc. of the commercial power supply to turn the relay switch 8 on to initiate the backup operation. The memory 3 is comprised of a semiconductor memory of the type required to be supplied with a power at all times, such as, for example, a RAM or an EPROM. Ordinarily, the memory 3 receives a power from the stabilized power supply circuit 1 to operate in accordance with an address signal or control signals from the memory control circuit 4. In contrast, when an output voltage from the stabilized power supply circuit 1 is lowered by an extraordinary state of the commercial power supply such as a service interruption, the memory 3 receives a power from the memory backup power supply 9 to retain data stored therein.

The RC time constant circuit 15 delivers a reset signal of which logic level is low ("L") only for a time period determined depending upon the time constant of the resistor 5 and the capacitor 6 to the reset terminal RS of the memory control circuit 4 at the time when the main power supply is turned on, or at the time of recovery of service interruption. The clear switch 12 is a manual push-button switch operated in the case of clearing the memory 3. When the manual push-button switch is depressed, a memory clear signal of "L" level is delivered to the memory clear terminal $\overline{MCL}$ of the memory control circuit 4. Thus, the memory control circuit 4 recognizes "L" level of the reset signal as a reset command to reset the internal status into an initial state. When resetting is made, the memory control circuit 4 executes a predetermined initial routine to check the level of the memory clear signal in that routine. At that time, if the clear switch 12 is depressed, i.e., the memory clear signal is at "L" level, the memory control circuit 4 recognizes it as a memory clear command, thus to clear the data stored in the memory 3.

In such a memory drive circuit, where an output voltage from the power supply circuit 1 gently rises in a time nearly to the time constant of the time constant circuit 15 or more, since the logic level of the reset terminal $\overline{RS}$ has reached high ("H") when the memory control circuit 4 has become operative, the memory control circuit 4 is unable to be reset. Further, where the backup power supply 9 is dissipated during service interruption, if user forgets depressing the clear switch 12 at the time of recovery of service interruption without being aware of the dissipation of the backup power supply 9, an erroneous operation of the apparatus would occur in accordance with the deteriorated data in the memory 3. As stated above, where a rise speed of the power supply voltage is slow, or where the backup power supply is dissipated during service interruption, a correct operation of the apparatus cannot be guaranteed.

Figure 2:
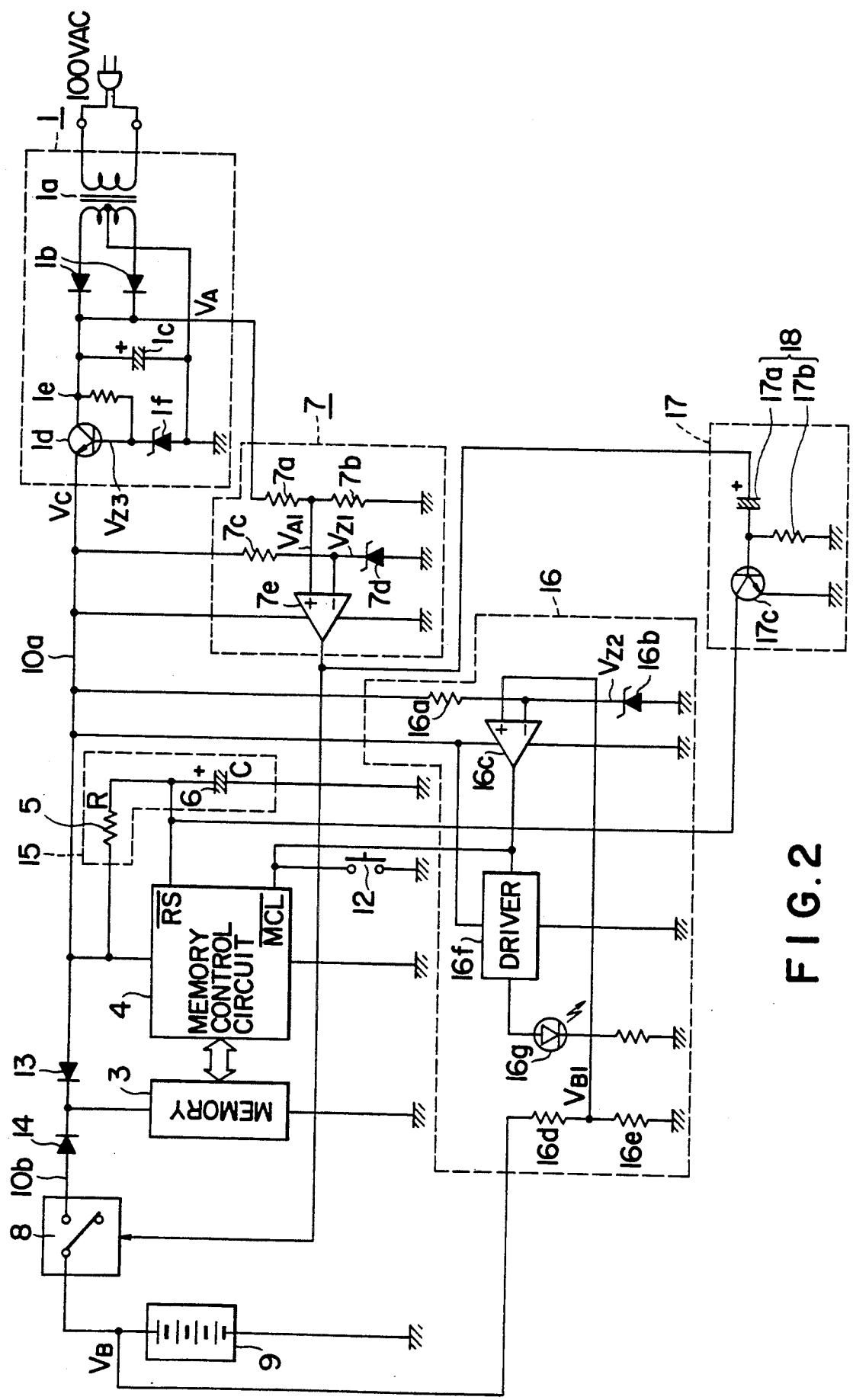
FIG. 2 is a block diagram showing an entire circuit configuration of a memory drive device in accordance with an embodiment of this invention.

FIG. 2 is a block diagram showing an entire circuit configuration of a memory drive device in accordance with an embodiment of this invention. The same components as those of the conventional device shown in FIG. 1 are designated by the same reference numrals, respectively.

In FIG. 2, the stabilized power supply circuit 1 serving as the main power supply receives an AC voltage of 100 V from the commercial power supply to output DC regulator voltages VC and rectification voltages VA to the main power supply line 10a and the power supply voltage sense circuit 7, respectively.

The detailed description of the internal configuration of the stabilized power supply circuit 1 is as follows. Namely, the transformer 1a steps down an AC voltage applied from the commercial power supply to a predetermined value. The rectification circuit 1b applies full-wave rectification to an output from the transformer 1a to convert it to a corresponding DC voltage. The capacitor 1c removes a ripple of the DC voltage outputted from the rectification circuit 1b to form a substantially rectification voltage VA. The control transistor 1d receive at its base a constant Zener voltage VZ3 generated by the Zener diode 1f to generate at its emitter a regulator voltage VC (=VZ3−VBE) to deliver it to the power supply line 10a.

When the backup power supply 9 is connected to the power supply line 10b as a result of the fact that the relay switch 8 is turned on,. this power supply 9 delivers a backup power to the memory 3 through the power supply line 10b and the reverse-current prevention diode 14.

When an output voltage VA from the stabilized power supply circuit 1 is lowered to a predetermined value, the power supply voltage sense circuit 7 senses this, thus to turn the relay switch 8 on.

The detailed description of the internal configuration of the power supply voltage sense circuit 7 is as follows. Namely, the output voltage VA from the stabilized power supply circuit 1 is voltage-divided by resistors 7a, 7a. The divided voltage VA1 thus obtained is delivered to the non-inverting input terminal of the comparator 7e. On the other hand, the Zener voltage VZ1 generated by allowing a current to flow in the Zener diode 7d through the resistor 7c is inputted to the inverting input terminal of the comparator 7e. When the comparator 7e receives a power from the stabilized power supply circuit 1 through the power supply line 10a, it is driven to make a comparison between the divided voltage VA1 and the Zener voltage VZ1. As a result, when the divided voltage VA1 is lower than the Zener voltage VZ1, the comparator 7e outputs a signal of which logic level is "L". By this signal, the power supply changeover switch 8 is switched to the power supply line 10b side.

The memory clear signal output circuit 16 checks whether or not a backup voltage from the backup power supply 9 is lowered at the time of recovery of service interruption of the commercial power supply, or at the time of memory backup. As a result, when lowering of the backup voltage is sensed, the circuit 16 outputs a memory clear signal of "L" level to the memory control circuit 4 to clear memory contents of the memory 3. The detailed description of the internal configuration thereof is as follows. Namely, a Zener voltage VZ2 caused by allowing a current to flow in the Zener diode 16b through the resistor 16a is inputted to the inverting input terminal of the comparator 16c. Further, a voltage VB1 obtained by voltage-dividing an output voltage VB from the memory backup power supply 9 by resistors 16d, 16e is applied to the non-inverting input terminal of the comparator 16c. When the comparator 16c receives a power from the stabilized power supply circuit 1 through the power supply line 10a, it is driven to output, to the memory control circuit 4, a memory clear signal whose logic level is "L" to clear memory contents in an initial routine when the divided voltage VB1 is lower than the Zener voltage VZ2. This memory clear signal is also delivered to the driver 16f for the light emitting diode 16g. The driver 16f becomes operative by a power delivered from the power supply circuit 1 to turn the light emitting diode 16g on and off when the memory clear signal is at "L" level, thereby notifying user of dissipation of the backup power supply 9.

The reset signal output circuit 17 generates a reset signal ($\overline{RS}$) in response to the above-described memory control circuit 4 by using the detection signal of a power supply voltage detection circuit 7 that outputs a detection signal after detecting that an output voltage of the stabilized power supply circuit 1 reaches a predetermined voltage.

At the time of recovery of service interruption, or at the time of turning a power on, a rectification voltage of the stabilized power supply circuit rises, and when it is detected by the comparator 7e of the power supply detection circuit that a rectification voltage divided by resistors 7a and 7b is higher than a Zener voltage VZ1, the output of the comparator 7e changes to a high level.

In accordance with a rise in the output of the comparator with increase in the output voltage of the stabilized power supply circuit 1, a differential pulse is formed at a differentiating circuit 18 of the reset signal output circuit 17.

The pulse makes a transistor 17c conductive, discharges a charge of a capacitor 6 in a time constant circuit 15, and generates a negative pulse serving to reset the memory control circuit 4 at the collector of the transistor 17c in the reset signal output circuit 17.

The negative pulse further continues during a period of continuity of the transistor 17c whose continuity starts with the differentiation pulse. After continuity of the transistor 17c is cut off, charging of the capacitor 6 in the time constant circuit 15 starts. When charging voltage rises higher than voltage that can maintain reset for the memory control circuit 4 after a rise in charging voltage from continued charge to the capacitor 6, the memory control circuit 4 is released from the reset.

That is, when the output voltage of the stabilized power supply circuit 1 rises in the process where the power supply voltage rises up to a predetermined voltage and the transistor 17c in the reset signal output circuit 17 becomes conductive by the output of the comparator 7 in the power supply detection circuit 7, electric potential of the reset terminal in the memory control circuit 4 falls, causing reset operation for the memory control circuit 4.

The reset operation period depends on the time constant determined by the capacitor 17a and the resistor 17b forming the differentiating circuit 18. After the reset operation and lapse of a fixed period of time, the transistor 17c is broken, causing the reset operation to be released by a rise in the potential of the reset terminal $\overline{RS}$.

The memory control circuit 4 comprises, e.g., a microcomputer, executing an initial routine after the reset operation. This initial routine monitors the logic level of a memory clear signal terminal $\overline{MCL}$ in the memory control circuit 4. The initial routine monitors logic level of the memory clear signal terminal $\overline{MCL}$ in the memory control circuit 4. When the logic level is detected to be "L" level in the initial routine, the memory control circuit 4 clears the contents of the memory 3.

Figure 3:
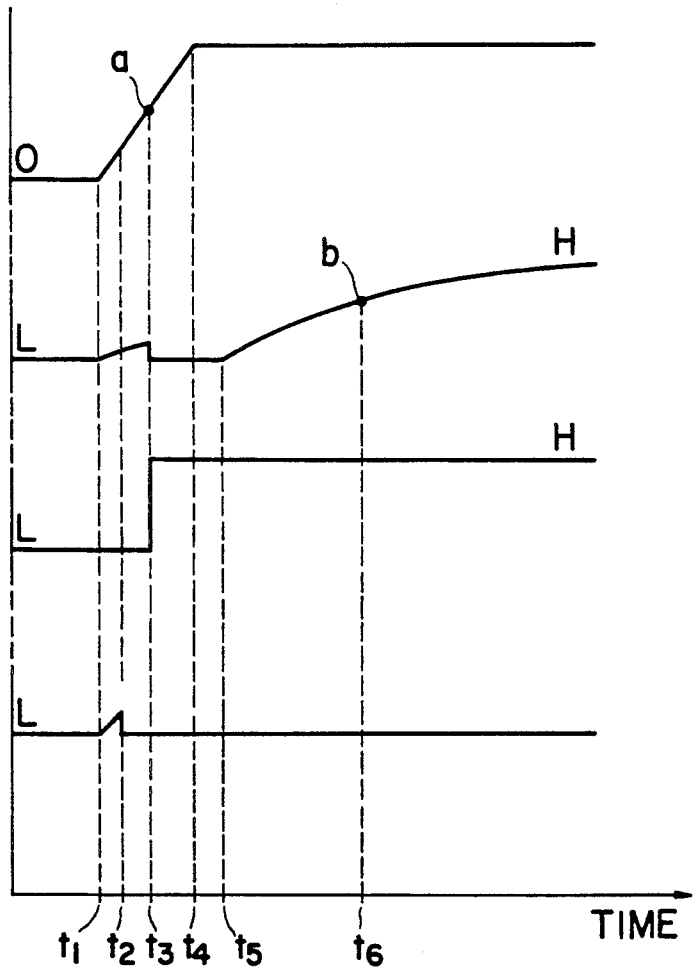
FIG. 3A to D are signal waveform diagrams showing the operation at the time of recovery of power interruption of the memory drive device in accordance with the embodiment of this invention.

FIG. 3 is a waveform diagram showing voltage waveform at each section in a process where an output voltage value of the stabilized power supply circuit 1 at time t0, rises to a predetermined value after recovery of service interruption or the power supply is turned on.

The reset operation of the memory control circuit 4 and the clearing of the memory at the time of recovery of service interruption are described with reference to FIG. 3.

In FIG. 3, when the power supply voltage is recovered at time t0, the output VA serving as smoothing output of the stabilized power supply circuit 1 rises gradually as shown in FIG. 3A. As this voltage rises, the capacitor 6 in the time-constant circuit 15 connected to the reset terminal $\overline{RS}$ is progressively charged, causing the electric potential of the reset terminal $\overline{RS}$ to rise in accordance with the time constant determined by the capacitor 6 and the resistor 5 (shown in FIG. 3B).

When the smooth voltage VA of the stabilized power supply circuit 1 rises and the smooth voltage VA divided by the resistors 7a and 7b becomes:

$$VA \cdot \frac{R_{7b}}{R_{7a} + R_{7b}} = VZ1,$$

equalizing to the Zener voltage VZ1, the output of the power supply detection circuit 7 changes to a high level as shown in FIG. 3C.

The reset signal output circuit 17 is connected to the output terminal of the power supply voltage detection circuit 7. The base potential of the transistor 17c rises by the differentiating circuit 18 constituting the reset signal output circuit at time t2 as shown in FIG. 3D, and then falls according to the time constant determined by the capacitor 17a and resistor 17b constituting the differentiating circuit 18.

The transistor 17c of the differentiating circuit 18 becomes conductive only during the period when its base potential is higher than voltage VBE and continues conductive during the period of time t2 to t4. During the conductive period (time t2 to t4) of the transistor 17c, the level of the reset terminal $\overline{RS}$ is maintained at a low level because a charge of the capacitor 6 is discharged.

As a result, the memory control circuit 4 is reset during the period of t2 to t4. In this case, because the output VA of the stabilized power supply circuit 1 reaches a predetermined value at time t3, the memory control circuit 4 is reset during the period of t3 to t4.

The reset operation described above may be performed during the period of t2 to t3 depending on how low the power supply voltage below a rated potential is when the memory control circuit 4 starts normal operation.

The transistor 17c in the reset signal output circuit 17 becomes a cut-off condition after time t4 and the potential of the reset terminal $\overline{RS}$ rises in accordance with the time constant in the time constant circuit 15.

The potential of the reset terminal $\overline{RS}$ further rises and reset condition cannot be maintained at time t5. The memory circuit 4 is released from reset condition.

That is, the memory control circuit 4 is reset after the point a (time t2) in FIG. 3 and released at the point b (time t5) from reset condition.

After completion of the resetting and reset-release operations described above, the memory control circuit 4 executes an initial routine. In the initial routine, the contents of the memory is cleared as required. In this initial routine, the logic level of the memory clear terminal $\overline{MCL}$ in the memory control circuit 4 is monitored, and when the level is low, the contents of the memory 3 is cleared. The memory clear signal is generated by manual operation of the clear switch 12. On the other hand, after the reset operation the signal is automatically generated by the memory clear signal output circuit 16 in the initial routine in the memory control circuit 4.

In the memory clear signal output circuit 16, the memory clear signal $\overline{MCL}$ is generated by comparing, through the comparator 16c, the Zener voltage VZ2 on the Zener diode 16b with a divided voltage VB1 caused by dividing voltage VB of the backup power supply 9 with resistors 16d and 16e.

That is, when the batteries constituting the backup power supply 9 is below the rated voltage due to power dissipation and backs up the memory 3, the output of the comparator 16c is maintained at a low level to clear the memory contents of the memory 3. In this case, the LED blinks to show that power of the backup power supply 9 has dissipated.

When the output of the backup power supply 9 in backup is, on the contrary, at a rated voltage, the output of the comparator 16c is maintained at a high level. Thus the memory is not cleared by the abovementioned initial routine.

The memory contents of the memory 3 is cleared by manually pressing the clear switch 12 during the initial routine.

While the scope of this invention is limited to the above-described embodiment, this invention may be modified in various manners within a range which does not depart from the gist of the invention. For instance, the reset signal output circuit 17 as shown in FIG. 4 may be constructed with an one shot multivibrator 20 so that it receives, on the trigger terminal thereof, an output from the comparator 7e and is triggered by a rising edge in that output, thus to generate a negative pulse of a fixed time width, or as shown in FIG. 5, the reset signal output circuit 17 may be constructed using a retriggerable counter 22 so that it is triggered by a rising edge of the output from the comparator 7e and counts pulses from the clock 21 up to a fixed number, outputting negative signals in count operation.

What is claimed is:

1. A memory drive device comprising a semiconductor memory, a memory control circuit for controlling the operation of the memory, the control circuit including a reset terminal and operative to initialize the internal status when a reset signal of a predetermined level is applied to the reset terminal, and a main power supply for delivering a power to the memory and to the memory control circuit, the memory drive device comprising:
a comparator means for comparing a power feed voltage from the main power supply with a predetermined threshold voltage and for outputting a detection signal after detecting that the power feed voltage reaches a predetermined voltage; and
reset means responsive to a detection signal from the comparator means to apply the reset signal for at least a predetermined period of time to the reset terminal of the memory control circuit.

2. A memory drive device as set forth in claim 1, wherein the reset means comprises a switching element in response to the detection signal to turn on only during the predetermined period of time, and a time constant circuit to generate the reset signal while the switching element is on and to release the reset signal after the predetermined time constant when the switching element turns off.

3. A memory drive device as set forth in claim 1, wherein the reset means includes a one-shot multivibrator triggered by the stepwise change of the detection signal and operative only during the predetermined period of time, and a time constant circuit to generate the reset signal while the multivibrator is on and release the reset signal at the predetermined time constant after the multivibrator stops operation.

4. A memory drive device having a semiconductor memory, a memory control circuit for controlling the operation of the memory, the control circuit, a reset terminal and being operative to initialize the internal status when a reset signal of a predetermined level is applied to the reset terminal, and a main power supply for delivering power to the memory and to the control circuit, the memory drive device comprising:
comparator means for comparing a feed voltage from the main power supply with a predetermined threshold voltage and for outputting a detection signal after detecting that the feed voltage reaches a predetermined voltage,
reset means responsive to a detection signal from the comparator means to apply the reset signal for at least a predetermined period of time to the reset terminal of the memory control circuit,
a backup power supply for delivering power to the memory at the time of service interruption of the main power supply, and
means operated by power delivered from the main power supply to generate a dissipation detection signal for detecting that power of the backup power supply is dissipated,
the memory control circuit further having a memory clear terminal to clear the memory at the time of receiving the reset signal when the memory clear terminal receives the dissipation detection signal.

5. A memory drive device as set forth in claim 1, which further comprises means for visible display on receipt of the dissipation detection signal to notify duissipation of power of the backup power supply.

6. A memory drive device comprising a semiconductor memory, a memory control circuit for controlling the operation of the memory, the control circuit including a reset terminal and operative to initialize the internal status when a reset signal of a predetermined level is applied to the reset terminal, and a main power supply for delivering a power to the memory and to the memory control circuit, the memory drive device comprising:
  first reset means operative to receive an output voltage of said main power supply to generate a signal changing from a first logic level to a second logic level at a speed dependent upon a predetermined time constant at the time of rise of the output voltage, thus to apply it to the reset terminal,
  comparator means for comparing the output voltage of the main power supply with a predetermined threshold voltage, and
  second reset means responsive to an output signal from the comparator means to forcedly maintain an output signal from the first reset means at the first level for a predetermined time period.

7. A memory drive method using a memory control circuit for controlling the operation of the memory, the control circuit including a reset terminal and operative to initialize the internal status when a reset signal of a predetermined level is applied to the reset terminal, the memory drive method comprising the steps of:
  comparing a feed voltage which is supplied to the main memory and the memory control circuit with a predetermined threshold voltage and for outputting a detection signal after detecting that the feed voltage reaches a predetermined voltage, and
  in response to the detection signal, applying the reset signal for at least a predetermined period of time to the reset terminal of the memory control circuit.

* * * * *